US010885757B2

(12) United States Patent
Duric et al.

(10) Patent No.: US 10,885,757 B2
(45) Date of Patent: Jan. 5, 2021

(54) OPTICAL SMOKE DETECTION ACCORDING TO THE TWO-COLOR PRINCIPLE BY MEANS OF A LIGHT EMITTING DIODE WITH AN LED CHIP FOR LIGHT EMISSION AND WITH A LIGHT CONVERTER FOR CONVERTING PART OF THE EMITTED LIGHT INTO LIGHT OF LONGER WAVELENGTH

(71) Applicant: Siemens Schweiz AG, Zürich (CH)

(72) Inventors: Aleksandar Duric, Zug (CH); Hilmar Konrad, Baar (CH)

(73) Assignee: SIEMENS SCHWEIZ AG, Zurich (CH)

( * ) Notice: Subject to any disclaimer, the term of this patent is extended or adjusted under 35 U.S.C. 154(b) by 0 days.

(21) Appl. No.: 16/480,776

(22) PCT Filed: Jan. 19, 2018

(86) PCT No.: PCT/EP2018/051293
§ 371 (c)(1),
(2) Date: Dec. 13, 2019

(87) PCT Pub. No.: WO2018/138004
PCT Pub. Date: Aug. 2, 2018

(65) Prior Publication Data
US 2020/0152034 A1 May 14, 2020

(30) Foreign Application Priority Data
Jan. 25, 2017 (EP) .................................... 17153015

(51) Int. Cl.
G08B 17/10 (2006.01)
G08B 17/107 (2006.01)
(Continued)

(52) U.S. Cl.
CPC ........... *G08B 17/107* (2013.01); *G01N 15/06* (2013.01); *H01L 33/505* (2013.01); *H05B 45/10* (2020.01);
(Continued)

(58) Field of Classification Search
CPC ...... G08B 17/107; H05B 45/10; G01N 15/06; G01N 2015/0693; H01L 33/505; H01L 33/486
(Continued)

(56) References Cited

U.S. PATENT DOCUMENTS 5,148,020 A * 9/1992 Machida ............... G01D 5/36
250/231.16
5,502,434 A * 3/1996 Minowa ............... G08B 17/103
250/574
(Continued)

FOREIGN PATENT DOCUMENTS

| DE | 20 2014 009 738 U1 | 3/2015 | ............. G01N 15/14 |
| EP | 2 908 298 B1 | 4/2018 | ........... G08B 17/107 |
| WO | 2018/138004 A1 | 8/2018 | ............. H01L 33/50 |

OTHER PUBLICATIONS

Kim, J. S. et al., "Warm-white-light emitting diode utilizing a single-phase full-color Ba3MgSi2O8:Eu2+,Mn2+ Phosphor," Applied Physics Letters, vol. 84, No. 15, 2931-2933, Apr. 12, 2004.
(Continued)

Primary Examiner — Kerri L McNally
Assistant Examiner — Thang D Tran
(74) Attorney, Agent, or Firm — Slayden Grubert Beard PLLC

(57) ABSTRACT

An optical smoke detector using a two-color principle is provided. The smoke detector may include a light emitting diode (LED), and a photosensor spectrally coordinated with the LED. The LED includes an LED chip configured to emit
(Continued)

light in a first wavelength range, and a light converter configured to convert part of the emitted light from the LED chip into light in a second wavelength range, wherein the second wavelength range has a spectral half-width having a maximum of 150 nm.

16 Claims, 4 Drawing Sheets

(51) Int. Cl.
*H05B 45/10* (2020.01)
*G01N 15/06* (2006.01)
*H01L 33/50* (2010.01)
*H01L 33/48* (2010.01)

(52) U.S. Cl.
CPC .... *G01N 2015/0693* (2013.01); *H01L 33/486* (2013.01)

(58) Field of Classification Search
USPC .......................................................... 340/630
See application file for complete search history.

(56) References Cited

U.S. PATENT DOCUMENTS

| | | | | | |
|---|---|---|---|---|---|
| 6,166,647 | A * | 12/2000 | Wong | ...................... | G08B 17/10 340/522 |
| 6,271,758 | B1 * | 8/2001 | Nakamura | ........... | G08B 17/103 250/564 |
| 7,323,673 | B1 * | 1/2008 | Ake | ...................... | G01J 1/4228 250/214 R |
| 7,835,251 | B2 * | 11/2010 | Ohyama | ................ | G11B 7/005 369/112.1 |
| 2001/0038338 | A1 * | 11/2001 | Kadwell | .............. | G08B 17/113 340/630 |
| 2003/0132388 | A1 * | 7/2003 | Matsukuma | ........... | G08B 17/12 250/339.15 |
| 2004/0155609 | A1 * | 8/2004 | Lys | ........................ | H05B 45/20 315/292 |
| 2006/0027770 | A1 * | 2/2006 | Struye | .................... | G03B 42/08 250/586 |
| 2008/0192613 | A1 * | 8/2008 | Mori | ..................... | G02B 5/1866 369/112.23 |
| 2009/0051987 | A1 * | 2/2009 | Dultz | ..................... | G03H 1/06 359/3 |
| 2010/0259190 | A1 | 10/2010 | Aikala et al. | .................. | 315/294 |
| 2011/0255265 | A1 | 10/2011 | Nammalwar et al. | ........... | 362/84 |
| 2012/0140231 | A1 * | 6/2012 | Knox | ................... | H01L 29/7786 356/442 |
| 2012/0229038 | A1 | 9/2012 | Zeng et al. | ..................... | 315/192 |
| 2013/0135607 | A1 * | 5/2013 | Wedler | .................... | G01N 21/53 356/51 |
| 2014/0168647 | A1 * | 6/2014 | Ju | .......................... | G01N 21/53 356/338 |
| 2015/0129747 | A1 * | 5/2015 | Petilli | ............... | H01L 27/14627 250/208.1 |
| 2015/0170490 | A1 * | 6/2015 | Shaw | .................... | G08B 17/103 250/459.1 |
| 2015/0228171 | A1 * | 8/2015 | Aebersold | ............ | G08B 17/107 340/630 |
| 2015/0253487 | A1 * | 9/2015 | Nichol | ................... | G02B 6/006 362/610 |
| 2015/0346086 | A1 * | 12/2015 | Erdtmann | ............ | G08B 17/107 250/574 |
| 2016/0054281 | A1 * | 2/2016 | Smeeton | ............ | G01N 21/3103 250/373 |
| 2016/0141467 | A1 * | 5/2016 | Li | .......................... | H01L 33/504 257/98 |
| 2016/0178141 | A1 * | 6/2016 | Bichler | ................... | F21S 10/02 362/84 |
| 2016/0372638 | A1 * | 12/2016 | Todorov | ................ | H01L 33/504 |
| 2017/0191930 | A1 * | 7/2017 | Warren | ..................... | G01K 7/01 |
| 2019/0021150 | A1 * | 1/2019 | Butendeich | ............ | H05B 45/20 |
| 2019/0055467 | A1 * | 2/2019 | Ota | .......................... | C09D 5/22 |

OTHER PUBLICATIONS

Yang, Woan-Jen, et al., "Luminescence and Energy Transfer of Eu- and Mn-Coactivated CaAl2Si2O8 as a Potential Phosphor for White-Light UVLED," American Chemical Society, Chem. Mater., vol. 17, No. 15, 2005, pp. 3883-3888, Jun. 21, 2005.
Coe-Sullivan, Seth, "Quantum Dots, Product Form Factors, Green Manufacturing," 2014 Solid-State Lighting Manufacturing R&D Workshop, San Diego, 30 pages, May 8, 2014.
Chowdhury, Ashfaq, "Characterization for Manufacturing Controls, and Usage in High Performance LED Systems," 2014 Solid-State Lighting Manufacturing R&D Workshop, San Diego, 17 pages, May 8, 2014.
International Search Report and Written Opinion, Application No. PCT/EP2018/051293, 18 pages, dated Apr. 24, 2018.

* cited by examiner

OPTICAL SMOKE DETECTION ACCORDING TO THE TWO-COLOR PRINCIPLE BY MEANS OF A LIGHT EMITTING DIODE WITH AN LED CHIP FOR LIGHT EMISSION AND WITH A LIGHT CONVERTER FOR CONVERTING PART OF THE EMITTED LIGHT INTO LIGHT OF LONGER WAVELENGTH

CROSS-REFERENCE TO RELATED APPLICATIONS

This application is a U.S. National Stage Application of International Application No. PCT/EP2018/051293 filed Jan. 19, 2018, which designates the United States of America, and claims priority to EP Application No. 17153015.7 filed Jan. 25, 2017, the contents of which are hereby incorporated by reference in their entirety.

TECHNICAL FIELD

The invention relates to an arrangement for optical smoke detection according to a two-color principle, and further relates to a particular use of a light emitting diode for optical smoke detection according to a two-color principle.

BACKGROUND

EP 2 908 298 A1 (=DE 20 2014 009 748 U1) discloses a smoke detector with a detection unit that functions according to the scattered light principle, having a light emitting diode and photosensor which is spectrally sensitive thereto in a scattered light arrangement. The light emitting diode comprises a first LED chip and second LED chip for emitting a first and second light pencil with light in a first wavelength range from 350 nm to 500 nm and in a second wavelength range from 665 nm to 1000 nm. Both LED chips are arranged adjacently on a chip carrier of the light emitting diode and can be triggered for light emission independently of each other.

By suitably evaluating the two scattered light intensities detected by the photosensor, it is possible to distinguish between smoke, dust and water vapor according to the two-color ratio principle. It is thereby possible to prevent the output of a possible false alarm in the case of smoke detection. However, the adjacent arrangement of the two LED chips on the chip carrier has the disadvantageous consequence that the two emitted light pencils do not travel along the same optical path. Moreover, the two light pencils emerging from the light emitting diode are offset from the geometric main axis of the light emitting diode and also have an angular offset of several degrees relative to each other. This results in two scattered light centers which differ from each other and partially overlap during the optical scattered light smoke detection. When measuring the transmitted light, already after a short measuring distance, only one of the two main lobes of the light pencil can be detected by the photosensor due to the angular deviation. In both cases, this results in significant metrological inaccuracies when determining the smoke particle size and therefore the type of smoke.

For the purpose of promoting plant growth, particularly in greenhouses, US 2010/0259190 A1 discloses a lighting body for artificial lighting and a component which emits magenta or purple colored light. The light fixture has a single LED chip and a light converter with at least one fluorescent luminophore. The light fixture emits light with at least two emission peaks in the wavelength range from 300 nm to 800 nm. At least one of the emission peaks has a spectral half-width (FWHM) of at least 50 nm. The emission peaks of the emitted light are spectrally coordinated with the absorption spectrum of the plants which is required for photosynthesis. The subject matter of US 2010/0259190 A1 therefore relates to a completely different technical field.

Taking as a starting point the prior art cited in the introduction, an object of embodiments of the invention is to specify an improved arrangement for optical smoke detection, in particular an arrangement in which the two light pencils of different wavelengths emitted by the light emitting diode follow the same optical path.

A further object of embodiments of the invention is to specify a suitable use of a light emitting diode for optical smoke detection according to the two-color principle.

SUMMARY

One embodiment provides a system for optical smoke detection using a two-color principle. The system includes a light emitting diode (LED) and a photosensor spectrally coordinated with the LED. The LED comprises an LED chip configured to emit light in a first wavelength range, and a light converter configured to convert part of the emitted light from the LED chip into light in a second wavelength range, wherein the second wavelength range has a spectral half-width having a maximum of 150 nm, e.g., a maximum of 100 nm, or a maximum of 75 nm, or a maximum of 50 nm.

In one embodiment, the light converter has at least one luminophore with luminescent properties, such that a relative light flux $\Phi_{rel}$ of a total emitted light between a main wavelength $\lambda_1$ of the first wavelength range and a main wavelength $\lambda_2$ of the second wavelength range does not exceed a light flux value of a maximum of 15% of a maximum light flux value that is normalized relative to 100% in a total emission spectrum of the LED, within a minimum bandwidth of 100 nm.

In one embodiment, the light converter is deposited directly on the LED chip or arranged at a distance from the LED chip.

In one embodiment, the light converter has at least one fluorescent luminophore comprising inorganic crystalline materials with doping elements introduced into the crystal structure as imperfections.

In one embodiment, the light converter has at least one phosphorescent luminophore comprising inorganic crystalline materials with doping elements introduced into the crystal structure as imperfections.

In one embodiment, the at least one luminophore has (a) a fall half-value period $(\tau_f)$ in the range from 10 μs to 50 ms for a period of persistence of the luminophore following a discontinuation of an optical excitation by the LED chip, and/or (b) a rise half-value period $(\tau_r)$ in the range from 10 μs to 50 ms for an optical charging of the luminophore starting with the optical excitation by the LED chip.

Another embodiment provides a smoke detector includes an optical smoke detection unit using a two-color principle and comprising a light emitting diode (LED) and a photosensor spectrally coordinated with the LED. The LED comprises an LED chip configured to emit light in a first wavelength range, and a light converter configured to convert part of the emitted light from the LED chip into light in a second wavelength range, wherein the second wavelength range has a spectral half-width having a maximum of 150 nm. The smoke detector also includes a control unit connected to the LED and to the photosensor and configured to trigger the LED for light emission, detect a photosensor signal of the photosensor, determine a first light intensity for the first wavelength range and a second light intensity for the second wavelength range based on a temporal analysis of the photosensor signal, determine a two-color ratio or a two-color difference based on the first and second light intensities, and perform a fire alarm function based at least on the determined two-color ratio or the two-color difference.

In one embodiment, the photosensor comprises a two-channel photosensor and includes two photosensor units, an optical filter is connected in front of at least one of the two photosensor units and allows light in the first wavelength range or in the second wavelength range to pass, and the control unit is configured to determine the two-color ratio or the two-color difference based on the determined first and second light intensities.

In one embodiment, the photosensor comprises a single-channel photosensor, an electrically switchable optical filter is connected in front of the single-channel photosensor and is configured to filter out light in at least one of first and second wavelength ranges in alternating phases, and the control unit is configured to electrically trigger the optical filter in an alternating manner, and generate the two-color ratio or the two-color difference based on the light intensities of the photosensor signal that are temporally assigned to the alternating phases.

In one embodiment, the control unit is configured to (a) determine the two-color ratio or the two-color difference based at least on a magnitude of an abrupt signal rise of the detected photosensor signal immediately after the LED is switched on, and/or (b) determine the two-color ratio or the two-color difference based at least one a magnitude of an abrupt signal fall of the detected photosensor signal immediately after the LED is switched off.

In one embodiment, the control unit is configured to repeatedly trigger the LED in a first smoke detection phase using a switch-on period ($T_{ON}$) in a period range of a rise half-value period ($\tau F$)±50% to emit light predominantly in the first wavelength range, the control unit is further configured to trigger the LED in a second smoke detection phase using a switch-on period ($T_{ON}$) in a period range of a multiple of the rise half-value period ($\tau F$) in the event that the detected photosensor signal deviates by a minimum value from a predetermined signal limit value, and the control unit is configured to (a) determine, in the second smoke detection phase, the two-color ratio or the two-color difference based at least on a magnitude of an abrupt signal rise of the detected photosensor signal immediately after the LED is switched on, and/or (b) determine the two-color ratio or the two-color difference based at least on a magnitude of an abrupt signal drop of the detected photosensor signal immediately after the LED is switched off.

In one embodiment, the smoke detector further includes a housing, wherein the LED and the photosensor are arranged in a scattered light arrangement and directed at a common scattered light center, wherein the housing includes smoke entry openings for passage of ambient air into an interior of the housing, and wherein the housing is screened against penetration of direct ambient light into the interior of the housing.

In one embodiment, the smoke detection unit is arranged in a housing, the LED and the photosensor are arranged such that the photosensor detects direct light from the LED, the housing includes smoke entry openings for passage of ambient air into an interior of the housing, and the housing is screened against penetration of direct ambient light into the interior of the housing.

In one embodiment, the smoke detector further comprises a housing, wherein the smoke detection unit is arranged in the housing, and wherein the LED and the photosensor are arranged in or on the housing and are directed optically at a common scattered light center located outside the smoke detector.

Another embodiment provides a method of optical smoke detection using a light emitting diode (LED) according to a two-color principle, wherein the LED comprises controlling an LED chip to provide pulsed light emission in a first wavelength range, and using a light converter having at least one luminophore to convert part of the emitted light from the LED into light in a second wavelength range, wherein the second wavelength range has a spectral half-width having a maximum of 150 nm, e.g., a maximum of 100 nm, or a maximum of 75 nm, or a maximum of 50 nm.

In one embodiment, the method includes temporally changing light portions in the first and second wavelength range within a light pulse, wherein the at least one luminophore has (a) a fall half-value period ($\tau_f$) in the range from 10 µs to 50 ms for a period of persistence of the luminophore following a discontinuation of an optical excitation by the LED chip, or (b) a rise half-value period ($\tau_r$) in the range from 10 µs to 50 ms for an optical charging of the luminophore starting with the optical excitation by the LED chip, and wherein the two-color ratio or the two-color difference is determined based on the temporally changing light portions within the light pulse.

BRIEF DESCRIPTION OF THE DRAWINGS

Example aspects and embodiments of the invention are explained in more detail below with reference to the drawing, wherein.

DETAILED DESCRIPTION

Figure 1:
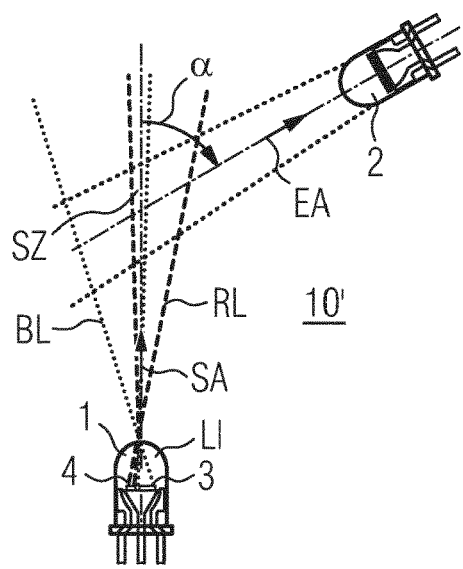
FIG. 1 shows a known arrangement for optical smoke detection according to the two-color principle, comprising a light emitting diode with two one-color LED chips and photosensor.

Some embodiments of the invention provide a light emitting diode and a photosensor which is spectrally coordinated therewith. The light emitting diode comprises an LED chip for emitting light in a first wavelength range and a light converter for converting part of the emitted light into light in a second wavelength range. The first wavelength range has a spectral half-width in the range from 20 nm to 50 nm, typically from 25 nm to 30 nm. The second wavelength range has a spectral half-width of a maximum of 100 nm, in particular a maximum of 75 nm and preferably a maximum of 50 nm.

The spectral half-width is also referred to in technical terms as FWHM (full width at half maximum). However, the LED chip already emits monochromatic light having a main wavelength.

A significant advantage of some embodiments is that the light pencil emitted by the light emitting diode, said light pencil comprising light that is mainly in the first and in the second wavelength range, follows the same optical path as in the case of a one-color light emitting diode with a single LED chip.

A further significant advantage of some embodiments is the conceivably simple structure of the light emitting diode in comparison with the adjacent arrangement of two one-color LED chips on an LED chip carrier, which is resource-intensive and expensive to produce. In the simplest case, in the context of the mass production of a conventional white-luminous light emitting diode, only the light converter is replaced by a light converter according to embodiments of the invention.

A further advantage of some embodiments is the lower energy consumption of the light emitting diode according to embodiments of the invention in comparison with a white-luminous LED for optical fire detection. The reason for this is that the luminophores required to generate green, yellow and orange light are not even present. Therefore no electrical energy is required for their emission. The energy efficiency or quantum efficiency of modern luminophores is already higher than 90%.

In addition, the electrical triggering of the light emitting diode is simpler than it is for a light emitting diode with two LED chips. A connection contact can also be advantageously omitted.

The light detected by the photosensor originates at least indirectly from the light emitting diode, i.e. it reaches the photosensor indirectly as scattered light from smoke particles that must be detected and/or on an optically direct path according to the transmitted light principle or extinction principle. The photosensor is in particular a photodiode, preferably a silicon photodiode or a silicon-PIN photodiode.

The light emitting diode has a (single) LED chip for emitting typically monochromatic light. The LED chip is preferably designed as a surface emitter. A "surface emitter", also referred to as a Lambertian source, signifies that the light is radiated from a plane surface with a Lambertian light distribution. The first wavelength range preferably extends in the range from 315 nm to 490 nm. This corresponds spectrally to the optical range from near-ultraviolet light (UV-A) to blue-green light. The second wavelength range preferably extends in the range from 640 nm to 1400 nm. This corresponds to the optical range from red/orange light to near-infrared light (NIR, IR-A). The second wavelength range therefore has longer waves than the first wavelength range. Such a light converter is therefore also referred to as a "down converter", i.e. the light converter absorbs part of the light emitted by the LED chip and changes it or converts it into light in the second wavelength range.

The light converter preferably has a so-called line emitter as a luminescent luminophore. Such a line emitter emits monochromatic light having a second main wavelength with a spectral half-width in the range from 20 nm to 50 nm. The more narrowband the second wavelength range, the more accurately the two-color ratio or the two-color difference and hence the smoke type is ascertained in this case.

In particular, the ratio of the maximum light flux value for the first main wavelength to the maximum light flux value for the second main wavelength lies in the range from 0.25 to 1.2, preferably in the range from 0.4 to 1. A preferred value is 0.5. This applies because the scattered light intensity of "blue" light at particles to be detected is seen to be significantly greater than that of "red" light for the same spectral light flux value.

The ratio of the portion of light or of the light flux value of the first wavelength range which is converted into light in the second wavelength range, to the total light or light flux value of the first wavelength range emitted by the LED chip, lies in particular in a range from 0.2 to 0.6 and preferably in the range from 0.33 to 0.5. The ratio of these two light flux values emitted into the environment can be adjusted e.g. by the layer thickness of the light converter and/or by the concentration of one or more luminophores in a transparent matrix of the luminophore, e.g. in silicone. In other words, as the layer thickness and luminophore concentration increases, the emitted blue light flux decreases and at the same time the emitted red light flux increases to a certain saturation limit.

The light emitting diode preferably has an axis of symmetry which is aligned with the main radiation direction of the LED chip. In particular, the axis of symmetry of the light emitting diode passes through the geometric center of the LED chip. The normal to the surface of the LED chip additionally runs parallel to the axis of symmetry of the LED chip. The axis of symmetry can also be designated as the structural main axis or longitudinal axis. In the case of popular 5 mm or 3 mm light emitting diodes which are sold "off the shelf" in large numbers as a consumer product, this is the axis of rotational symmetry relative to the plastic housing of such light emitting diodes. The light emitting diode typically has a housing of preferably transparent plastic. In this context, "transparent" means that the plastic housing is permeable to the totality of the light emitted by the light emitting diode. The housing typically forms an optical lens in the region along which the light emerges from the LED chip.

Alternatively, the light emitting diode can be a 3 mm light emitting diode. It can also alternatively be embodied for surface mounting, i.e. as an SMD light emitting diode.

According to one embodiment, the light converter has at least one luminophore with luminescent properties, such that the relative light flux $\Phi_{rel}$ of the total emitted light between a main wavelength $\lambda_1$ of the first wavelength range and a main wavelength $\lambda_2$ of the second wavelength range does not exceed a light flux value of a maximum of 15%, in particular a maximum of 10%, with reference to a maximum light flux value that is normalized relative to 100% in the total emission spectrum of the light emitting diode, within a minimum bandwidth of 100 nm. The emission spectrum of the light emitting diode therefore has a significant spectral band gap between the two "peaks" of the first and second wavelength range. The two wavelength ranges are clearly separated from each other spectrally by the band gap, such that the two-color ratio or the two-color difference can be precisely ascertained.

The light converter is therefore designed to convert a portion of the emitted light from the LED chip into light having preferably only a single main wavelength with maximum light flux value in the second wavelength range. Due to the complex quantum-mechanical energy conversion processes in the light converter, at least one further spectral secondary peak with a lower light flux value increase can develop in addition to the significant main wavelength in the second wavelength range.

In the specialist area of optical smoke detection, optical smoke detectors which function according to the two-color principle are also referred to as blue/red detectors, corresponding to the "blue" first wavelength range and the "red" second wavelength range. In this sense, the light emitted by the light emitting diode according to the present invention can also be referred to as light of the color "magenta", resulting from additive color mixing of blue and red light.

The inventive concept stems from the use of LED systems with only blue-light LEDs and red-light LEDs in greenhouses, which together emit magenta-colored light for the lighting of plants and can be triggered individually with regard to brightness depending on the type of plant (see e.g. LED lighting systems from the company Illumitex Inc., www.illumitex.com). This is based on the fact that the color spectrum between "red" and "blue" is not useful for photosynthesis and therefore for plant growth. By omitting the unnecessary color spectrum, the energy costs are considerably reduced in comparison with lighting using white LEDs.

The present invention takes up this energy-saving concept of omitting the colors between "blue" and "red" from the white lighting spectrum of the sun, and transfers it to a "blue/red detector". The further finding of the invention now is that the omission of the colors can also be effected by simply not including the luminophores required for the colors between "blue" and "red" in the light converter of a white-light LED.

According to an embodiment variant, the light converter is deposited directly on the LED chip or arranged at a distance from the LED chip. The light converter can be e.g. a paste or powder layer that can be deposited on the LED chip. The light converter can have e.g. a silicone matrix which is transparent to the light that must be emitted, and which is treated with at least one luminophore. Alternatively the light converter may be a light converter "plate" that can be applied to the LED chip or mounted at a distance therefrom.

The light converter preferably has at least one fluorescent luminophore. The luminophore comprises in particular inorganic crystalline materials with doping elements introduced into the crystal structure as imperfections. Designated as luminophores (phosphorus) are solid materials such as powders which exhibit luminescence as a result of light stimulus. A fluorescent luminophore exhibits a spontaneous emission of light, referred to as fluorescence, shortly after the optical stimulus. The period of such fluorescence is typically less than 1 microsecond.

Luminophores can be based on e.g. nitrides, yttrium-aluminum-garnet (YAG) or silicates. They can be doped with e.g. europium ($Eu^{2+}$) or with manganese ($Mn^{2+}$, $Mn^{4+}$).

By way of example, the publication US 2011/0255265 A1 describes the chemical/crystalline composition of a multiplicity of luminophores for the generation of yellow, green, orange or red light from blue or UV(A) light for the light stimulus. Known manufacturers of a multiplicity of luminophores for light conversion with LEDs are Intematix Corp., Lumiled Holding B.V. or General Electric Company. A manufacturer of infrared luminophores is e.g. the company Tailorlux GmbH.

Alternatively or additionally, the light converter can have a luminophore made of quantum dots with a nanoscopic material structure, typically made of a semiconductor material such as InGaAs, CdSe or GaInP/InP.

The paper entitled "Quantum Dots, Product Form Factors, Green Manufacturing" by Seth Coe-Sullivan, published on May 8, 2014 at the 2014 Solid-State Lighting Manufacturing R&D Workshop in San Diego, discloses a range of commercial quantum dot luminophores for color displays, which emit very narrowband red, green and blue light.

According to a further, particularly advantageous embodiment variant, the light converter has at least one phosphorescent luminophore. The luminophore comprises in particular inorganic crystalline materials with doping elements introduced into the crystal structure as imperfections. In contrast with fluorescence, phosphorescent luminophores exhibit a time delayed light emission following optical shortwave stimulus. In the case of phosphorescence, unlike fluorescence, a persistence occurs which can last up to several minutes depending on the luminophore. Conversely, a phosphorescing luminophore also requires a certain optical charge time in order to raise the energy captured from shortwave optical excitation to a higher energy on the basis of quantum-mechanical processes.

Such phosphorescent luminophores are described for example in the paper entitled "Luminescence and Energy Transfer of Eu- and Mn-Coactivated $CaAl_2Si_2O_8$ as a Potential Phosphor for White-Light UVLED" by Woan-Jen Yang, Liyang Luo, Teng-Ming Chen and Niann-Shia Wang, published on Jun. 21, 2005 by the American Chemical Society on the internet. Said paper also discloses that the persistence of $Mn^{2+}$ as an optical coactivator for $Eu^{2+}$ decreases as its quantitative proportion increases and is therefore adjustable.

The paper entitled "Warm-white-light emitting diode utilizing a single-phase full-color $Ba_3MgSi_2O_8$:$Eu^{2+}$, $Mn^{2+}$ phosphor" by J. S. Kim, P. E. Jeon, J. C. Choi and H. L. Park, published 2004 in Applied Physics Letters, volume 84, page 2931, discloses a luminophore for white-light LEDs which emits primarily red light having a persistence of 750 μs.

The paper entitled "Characterization for Manufacturing Controls, and Usage in High Performance LED Systems" by Ashfaq Chowdhury, published on May 8, 2014 at the 2014 Solid-State Lighting Manufacturing R&D Workshop in San Diego, discloses a very narrowband red-light luminophore based on potassium fluorosilicate (PFS) with an exponentially decreasing fall time constant and a correspondingly inverse exponentially increasing rise time constant of approximately 8.7 ms.

The publication US 2012/0229038 A1 describes various luminophores for white-light LEDs, which can be operated flicker-free with an alternating voltage of 50 Hz or 60 Hz. The luminophores disclosed therein have a persistence in the range from 1 to 10 ms.

Owing to the complex optical/chemical energy conversion processes in the light converter, fluorescent and phosphorescent conversion processes can overlap.

According to an embodiment variant, the at least one luminophore, in particular with phosphorescent properties, has a fall half-value period for the persistence of the luminophore following discontinuation of the optical excitation by the LED chip in the range from 10 µs to 50 ms, in particular in a range from 50 µs to 500 µs. Alternatively or additionally, the at least one luminophore has a rise half-value period for the optical charging of the luminophore starting with this optical excitation and in relation to a maximum excitation saturation value in the range from 10 µs to 50 ms, in particular in a range from 50 µs to 500 µs.

The fall half-value period designates as a characteristic measure that time period after which the light flux value of the light emitted by the luminophore, following discontinuation of the excitation by light in the first wavelength range, has decreased by half. The rise half-value period designates as a further characteristic measure that time period after which the light flux value of the light emitted by the luminophore, starting with the excitation by light in the first wavelength range, i.e. starting with a light flux value of 0, has reached half of the maximum light flux value that is subsequently reached asymptotically in the case of steady excitation.

Some embodiments provide a smoke detection unit which has an arrangement as disclosed herein. The control unit is connected to the light emitting diode and to the photosensor, in particular for signaling or data-related purposes. The control unit is configured or programmed to (electrically) trigger the light emitting diode for light emission, to detect a photosensor signal of the photosensor, to generate a first and second light intensity for the first and second wavelength range from a temporal analysis of the photosensor signal, to generate a two-color ratio or a two-color difference on the basis thereof, and to take the two-color ratio or the two-color difference into consideration for fire alarm purposes.

The control unit is preferably a microcontroller. It is configured or programmed to trigger the LED chip in an electrically pulsed manner for light emission. By generating a ratio or difference from the two respective signal amplitudes received from the photosensor and assigned to the "color", it is then possible to ascertain an equivalent particle size. This particle size can then be taken into consideration by the control unit for fire alarm purposes, i.e. when generating and outputting a fire alarm. For example, the control unit can be configured to output a corresponding warning message and/or alarm message as a result of comparing the light intensity of the first "blue" wavelength range and/or the light intensity of the second "red" wavelength range with a respective minimum concentration value.

The respective processing steps for the temporal triggering of the LED chip and the synchronized detection and evaluation of the photosensor signal, as well as the output of a fire alarm and/or a warning message, can generally be realized by means of suitable program steps that can be executed on the microcontroller.

According to an embodiment variant of the smoke detection unit, the photosensor is designed as a two-channel photosensor and has two photosensor units. The two-channel photosensor is preferably designed as a unitary part. The two photosensor units typically are arranged adjacent to each other and have the same optical orientation. An optical filter is connected in front of at least one of the photosensor units, and allows light in the first wavelength range or in the second wavelength range to pass. In other words, it may be that an optical filter is connected in front of only one of the two photosensor units, and essentially allows the passage of only light in the first or second wavelength range. It is also possible to connect an optical filter for the first wavelength range in front of the first photosensor unit and an optical filter for the second wavelength range in front of the second photosensor unit. The control unit is configured or programmed to generate the two-color ratio or the two-color difference from the two detected scattered light intensities of the photosensor. The respective optical filter can be e.g. a filter plate or a lake pigment which is mounted on or applied to the respective photosensor unit. An example of a two-channel photosensor is the photodiode of type BPW 34B, SFH 221 or SFH 7771 from the company OSRAM.

According to an alternative embodiment variant, the photosensor is designed as a single-channel photosensor, i.e. a "normal" photosensor. An electrically switchable optical filter is connected in front of the single-channel photosensor and is configured for the passage of light in at least one of the two wavelength ranges in alternating phases. The control unit is configured to electrically trigger the optical filter in an alternating manner and to generate the two-color ratio or the two-color difference from the respective photosensor signal that is temporally assigned to the alternating phases. An example of the single-channel photosensor is the photodiode of the type BPW 34B from the company OSRAM.

According to a further alternative embodiment variant, the control unit is configured to ascertain the two-color ratio or the two-color difference from the magnitude of an abrupt signal rise of the detected photosensor signal immediately after the light emitting diode is switched on. It is alternatively or additionally configured to ascertain the two-color ratio or the two-color difference from the magnitude of an abrupt signal drop of the detected photosensor signal immediately after the light emitting diode is switched off.

The particular advantage of this embodiment variant is that smoke detection according to the two-color principle can be realized using a single light emitting diode, which has only one LED chip, and a single single-channel (i.e. conventional) photosensor.

Immediately after it is switched on, the light emitting diode emits only "blue" light, i.e. light in the first wavelength range. This "blue" light is detected by the photosensor, either directly or as scattered light from smoke particles that must be detected. Immediately thereafter, the light emitting diode increasingly also emits "red" light, i.e. light in the second wavelength range, which originates from the luminophore in the light converter and which is likewise captured by the photosensor. In other words, the totality of the light emitted by the light emitting diode becomes increasingly "magenta-colored" over time. The totality of the light flux emitted by the light emitting diode therefore jumps to a "blue" light flux value immediately after switching on and asymptotically reaches a maximum "magenta-colored" light flux value after 5 to 7 rise half-value periods.

Conversely, the "blue" light portion of the total emitted "magenta-colored" light emitted by the light emitting diode expires immediately after the light emitting diode is switched off. Immediately thereafter, the light emitting diode emits progressively less "red" light, this originating from the luminophore in the light converter. The totality of the light flux emitted by the light emitting diode therefore jumps immediately after the light emitting diode is switched off from a maximum "magenta-colored" light flux value to a "red" light flux value and asymptotically reaches the light flux value 0 after 5 to 7 fall half-value periods.

According to a further embodiment variant, the control unit is configured to repeatedly trigger the light emitting diode in a first smoke detection phase using a switch-on period in the period range of the rise half-value period±50% in order to emit light predominantly in the first wavelength range, i.e. blue light. The control unit is further configured to trigger the light emitting diode in a second smoke detection phase using a switch-on period in the period range of the multiple of the rise half-value period in the event that the detected photosensor signal deviates by a minimum value from a predetermined signal limit value. The multiple here lies numerically in a range from 5 to 20. The light emitting diode therefore emits an essentially magenta-colored light in the second smoke detection phase. Lastly the control unit is configured to determine, in the second smoke detection phase, the two-color ratio or the two-color difference from the magnitude of an abrupt signal rise of the detected photosensor signal immediately after the light emitting diode is switched on. It is alternatively or additionally configured to determine the two-color ratio or the two-color difference from the magnitude of an abrupt signal drop of the detected photosensor signal immediately after the light emitting diode is switched off.

This has the particular advantage of allowing particularly low-current operation for the smoke detection. The emission of the particularly short and predominantly "blue" light pulses during the first smoke detection phase has the significant advantage that this light is scattered on both small smoke particles and on large particles such as dust or water vapor. By contrast, "red" light which is emitted for longer periods during the second smoke detection phase as part of the "magenta-colored" light is scattered only slightly on the small smoke particles. This advantageously ensures a comprehensive monitoring of both smoke particles and disturbances.

Typically, the "blue" light pulses of the first wavelength range are repeated, in particular cyclically, e.g. directed into a scattered light volume, e.g. with a repetition frequency in the range from 0.1 to 5 Hz. On a temporal average, the detected photosensor signal only rarely reaches a minimum threshold value, which corresponds to the unacceptable deviation by the minimum value from the predetermined signal limit value. Only if a sufficient concentration of smoke particles, dust or water vapor enters the scattered light volume is this minimum threshold value exceeded.

The term "abrupt" is intended to signify for both of the preceding embodiment variants that the signal rise or the signal fall by the previously cited magnitude takes place within a time window of less than 10 has, preferably within a time window of less than 3 μs.

Some embodiments provide a scattered light smoke detector having a housing and a smoke detection unit accommodated in said housing. The light emitting diode and the photosensor are arranged in a scattered light arrangement and directed at a common scattered light center. The housing has smoke entry openings for the passage of ambient air into the interior of the housing. The housing is screened against the penetration of direct ambient light into the interior of the housing.

Some embodiments provide an extinction smoke detector, i.e. a transmitted light smoke detector, having a housing and a smoke detection unit accommodated in said housing. The light emitting diode and the photosensor are arranged such that the photosensor detects direct light from the light emitting diode. The light emitting diode and the photosensor are therefore situated opposite each other, e.g. geometrically directly or via a mirror. The housing has smoke entry openings for the passage of ambient air into the interior of the housing. The housing is screened against the penetration of direct ambient light into the interior of the housing.

Some embodiments provide an open scattered light smoke detector having a housing and a smoke detection unit accommodated in said housing. The light emitting diode and the photosensor are arranged in or on the housing and are directed optically at a common scattered light center. The scattered light center is situated outside the scattered light smoke detector in the open and therefore outside the housing of the scattered light smoke detector.

Some embodiments provide a suitable use of a light emitting diode for optical smoke detection according to the two-color principle, in which the light emitting diode has a (single) LED chip for pulsed light emission in a first wavelength range and a light converter having at least one luminophore for converting part of the emitted light into light in a second wavelength range. The second wavelength range has a spectral half-width of a maximum of 100 nm, in particular a maximum of 75 nm and preferably a maximum of 50 nm.

According to a method variant, the light emitting diode is used in particular for pulsed light emission with temporally changing light portions of the first and second wavelength range within a light pulse. In this case, the at least one luminophore has a fall half-value period for the persistence of the luminophore following discontinuation of the optical excitation by the LED chip, or a rise half-value period for the optical charging of the luminophore starting with the optical excitation by the LED chip, in each case in the range from 10 μs to 50 ms, and in particular in a range from 50 μs to 5 ms. The fall half-value period and the rise half-value period are typically identical for a luminophore. The two-color ratio or the two-color difference is generated from the temporally changing light portions within a light pulse.

FIG. 1 shows a known arrangement 10' for optical smoke detection according to the two-color principle, comprising a light emitting diode 1 with two one-color LED chips 3, 4 and a photosensor 2. According to the scattered light arrangement shown, the photosensor 2 is arranged at a scattered light angle α of 60° to the light emitting diode 1 for the purpose of scattered light detection. EA designates the optical detection range of the photosensor 2.

The first LED chip 3 emits a first "blue" light pencil BL in a wavelength range from 350 nm to 500 nm. The second LED chip 4 emits a second "red" light pencil RL in a wavelength range from 665 nm to 1000 nm. Both LED chips 3, 4 are arranged adjacent to each other. LI designates a lens which is formed in the housing of the light emitting diode 1 and which focuses the light pencils BL, RL emitted by the two LED chips 3, 4. However, the adjacent arrangement of the two LED chips 3, 4 on the chip carrier has the disadvantageous consequence that the two emitted light pencils BL, RL do not travel along the same optical path. Moreover, the two light pencils BL, RL emerging from the light emitting diode 1 are offset from the geometric main axis SA of the light emitting diode 1 and also have an angular offset of several degrees relative to each other. The light emitting diode 1 therefore "squints".

Figure 2:
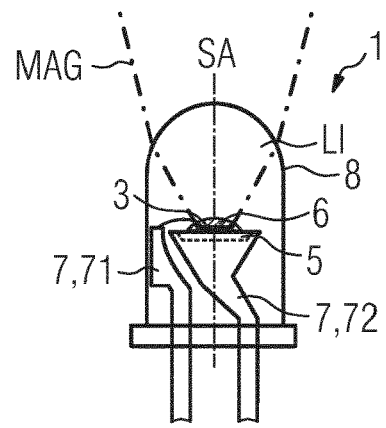
FIG. 2 shows an example of a light emitting diode according to one embodiment, comprising a single LED chip which has a light converter deposited thereon.

FIG. 2 shows an example of a light emitting diode 1 according to one embodiment, comprising a single LED chip 3 which has a light converter 6 deposited thereon. The LED chip 3 is arranged on a chip carrier 5 of the light emitting diode 1 and is preferably a surface emitter or Lambertian source. The term "surface emitter" here signifies that the light is radiated from a plane surface with a Lambertian light distribution. Alternatively, the LED chip 3 can also be a so-called edge emitter. SA designates the geometric main axis or axis of symmetry of the light emitting diode 1, which coincides with the optical transmission axis of the light emitting diode 1. The LED chip 3 is preferably arranged orthogonally relative to the geometric main axis SA. Furthermore, the geometric main axis SA of the light emitting diode 1 preferably runs through the geometric center of the LED chip 3. The light emitting diode 1 further comprises a transparent LED housing 8, preferably made of plastic or glass, in which the connection contacts 7, 71, 72 and the chip carrier 5 are arranged. In the present example, an optical lens LI for the concentration of light beams is formed in the LED housing 2 in the region of the light outlet from the light emitting diode 1.

According to one embodiment, the LED chip 3 is designed to emit light in a first wavelength range and the light converter is designed to convert part of the emitted light into light in a second wavelength range. The second wavelength range has a spectral half-width BR of a maximum of 100 nm, in particular a maximum of 75 nm and preferably a maximum of 50 nm. The first wavelength range extends in the range from 315 nm to 490 nm, which corresponds spectrally to a range from near-ultraviolet light (UV-A) to blue-green light. The second wavelength range extends in the range from 640 nm to 1400 nm, which corresponds spectrally to a range from red/orange light to near-infrared (NIR, IR-A). MAG designates a "magenta-colored" light pencil resulting from the additive color overlay of "blue" and "red". The main radiation direction thereof coincides with the geometric main axis SA or the optical transmission axis of the light emitting diode 1.

Figure 3:
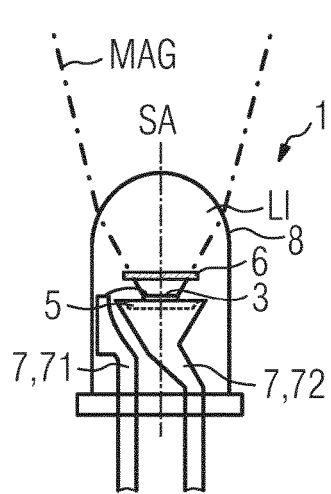
FIG. 3 shows an example of a light emitting diode according to one embodiment, comprising an LED chip and light converter plate.

FIG. 3 shows an example of a light emitting diode 1 according to one embodiment, comprising a light converter plate 3 which is connected optically downstream of the LED chip 3. The light converter plate 3, also referred to simply as a plate, is arranged parallel to the LED chip 3 and preferably at a distance in the range from 0.5 to 3 mm therefrom.

Figure 4:
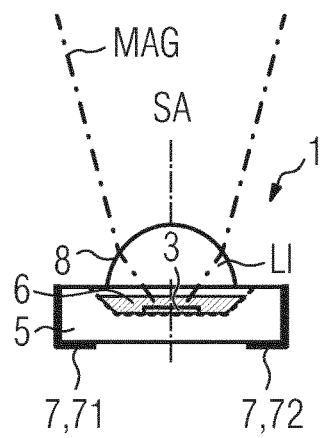
FIG. 4 shows an example of a light emitting diode according to one embodiment, using SMD structural format for the surface assembly.

FIG. 4 shows an example of a light emitting diode 1 according to one embodiment, being embodied in SMD structural format for surface assembly. In the present example, the SMD light emitting diode 1 has a hemispherical optical lens LI for particularly pronounced concentration of the emitted magenta-colored light pencil MAG.

Figure 5:
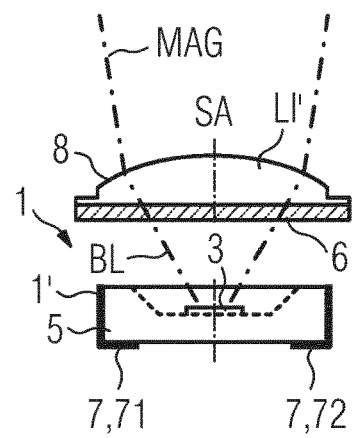
FIG. 5 shows a two-part embodiment variant of a light emitting diode according to one embodiment, comprising separate LED light body and lens with light converter at a distance therefrom.

FIG. 5 shows a two-part embodiment variant of a light emitting diode 1 according to one embodiment, comprising an LED light body 1' and, at a distance therefrom, a lens unit LI' with a light converter 6 deposited thereon. Both components 1, LI' are integral structural elements. The lens unit LI' is preferably so developed as to be inserted into a holder of a collimator (not shown) in order to delimit the emitted light pencil MAG. Therefore the LED light body 1' shown only emits a blue light pencil BL. This strikes the underside of the lens unit LI' shown in the present FIG. 5 and the light converter 6 deposited there. The "red" light emitted by the light converter 6 additively overlays the "blue" light from the LED light body 1' to form a magenta-colored light pencil MAG.

Figure 6:
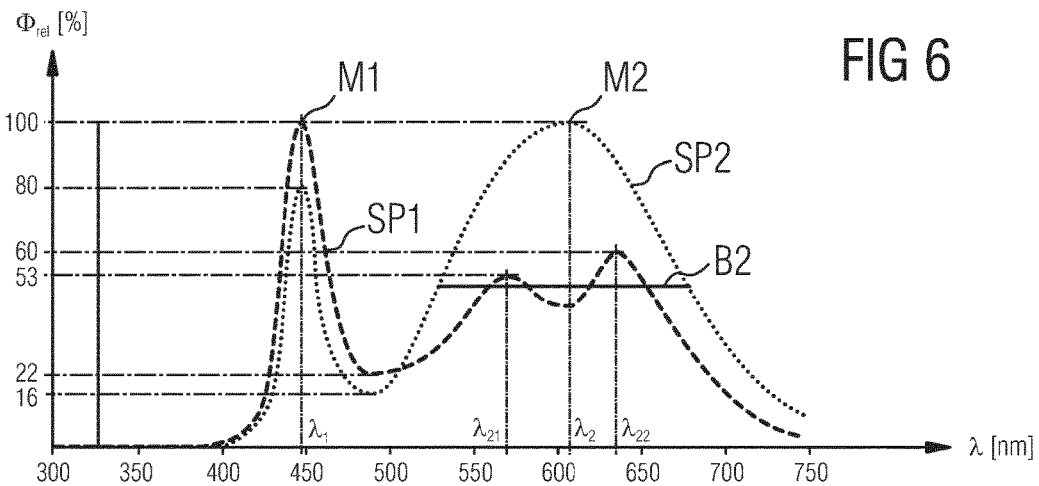
FIG. 6 shows the optical spectrum of two conventional white-light emitting diodes (cool white, warm white)

FIG. 6 shows the optical spectra SP1, SP2 of two conventional white-light emitting diodes (LED) of the types "cool white" and "warm white". The spectrum SP1 of the light emitting diode of the type "cool white" is represented by broken line. The spectrum SP2 of the light emitting diode of the type "warm white" is represented by a dotted line. λ designates the X-axis of the two spectra SP1, SP2 in nanometers and $\Phi_{rel}$ designates the relative light flux $\Phi_{rel}$ as the Y-axis. The latter is normalized relative to 100% of the respective maximum M1, M2 of the two spectra SP1, SP2.

Such light emitting diodes are designed to provide radiation in the widest possible bandwidth in an optical range visible to the humane eye for lighting purposes, but with an emphasis on a more blue "cooler" color temperature of typically 4000 K or on a more red "warmer" color temperature of typically 2700 K. This is achieved by a composition of a plurality of luminophores, which convert a portion of a light emitted by a "blue" LED chip in the first wavelength range having the main wavelength $\lambda_1$ of approximately 450 nm for the type "cool white" into two wider-band wavelength ranges having the main wavelengths $\lambda_{21}$ and $\lambda_{22}$. The one main wavelength $\lambda_{21}$ is approximately 570 nm and the other is approximately 630 nm. For the type "warm white", the main wavelength $\lambda_2$ lies in the second wavelength range at approximately 610 nm. The spectral half-width B2 is correspondingly wide. This is approximately 150 nm in the case of the exemplary spectrum SP2.

Figure 7:
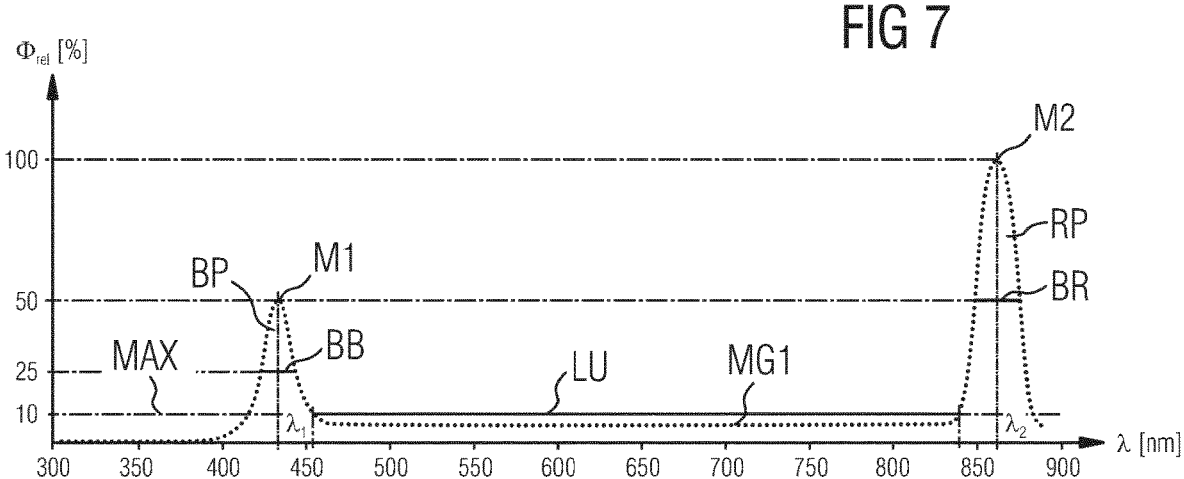
FIG. 7 shows the optical spectrum of an exemplary light emitting diode according to one embodiment, with two separate spectrally dominant wavelength ranges in the violet range and in the near-infrared range.

FIG. 7 shows the optical spectrum MG1 of an exemplary light emitting diode according to one embodiment, with two separate spectrally dominant wavelength ranges BP, RP in the violet range and in the near-infrared range. Even though both wavelength ranges BP, RP do not correspond directly to the color "blue" and are not anywhere in the optically visible range of the human eye, the colors "blue" and "red" which are intended to represent the two-color principle continue to be used for better understanding of the invention.

In the present example, the "blue" LED chip emits light having a main wavelength $\lambda_1$ of 430 nm. This is essentially monochromatic light, which is typical for the light emission of one-color LED chips. The spectral half-width BB here is approximately 20 nm. M1 designates the maximum of the relative light flux $\Phi_{rel}$ at 430 nm. The "blue peak" BP shown here represents the light portion that has not been converted by the light converter into light in the second wavelength range. The second wavelength range can be seen as "red peak" RP in the right-hand part of FIG. 7. It has a pronounced maximum M2 at a second main wavelength $\lambda_2$ of approximately 860 nm and is twice as great as the first maximum M1 at 50%.

FIG. 7 also shows that the spectral half-width BR of the right-hand red peak RP or in the second wavelength range is approximately 30 nm. The light converter preferably has a line emitter with suitable luminescent properties, in order to convert the stimulating light in the first wavelength range into preferably only narrowband light in the second wavelength range. According to one embodiment, this results in two widely separated narrowband wavelength ranges BP, RP with a minimum bandwidth or band gap LU of more than 350 nm. This allows the smoke type to be ascertained in a particularly effective, energy-saving and precise manner according to the two-color principle. The minimum bandwidth LU in this example relates to a maximum light flux value MAX of 10%, wherein the spectral light flux portions in the "magenta-colored" spectrum MG1 shown do not exceed the maximum light flux value MAX.

Figure 8:
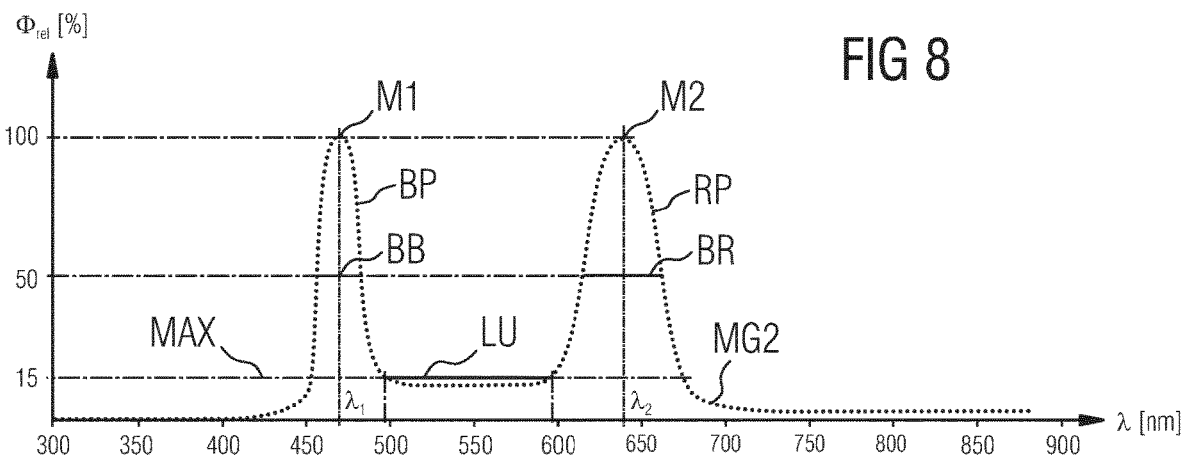
FIG. 8 shows the optical spectrum of a further exemplary light emitting diode according to one embodiment, with two separate spectrally dominant wavelength ranges in the violet range and in the red range.

FIG. 8 shows the optical spectrum MG2 of a further exemplary light emitting diode according to one embodiment, with two separate spectrally dominant wavelength ranges BP, RP in the violet and in the red range. In comparison with the previous embodiment variant, the two wavelength ranges BP, RP lie in the optically visible range. In the example according to FIG. 8, the "blue" LED chip emits light having a main wavelength $\lambda_1$ of 470 nm. The spectral half-width BB here is approximately 25 nm. M1 designates the maximum of the relative light flux $\Phi_{rel}$ at 470 nm and is exactly as great as the maximum M2 of the spectral "blue peak" shown in the right-hand part of FIG. 8 with a main wavelength $\lambda_2$ of approximately 640 nm. Furthermore, the spectral half-width BR of the right-hand red peak RP or in the second wavelength range is approximately 45 nm. According to one embodiment, this results in two separate narrowband wavelength ranges BP, RP with a minimum bandwidth or band gap LU of 100 nm. The minimum bandwidth LU in the present example relates to a maximum light flux value MAX of 15%, wherein the spectral light flux portions in the "magenta-colored" spectrum MG2 shown do not exceed the maximum light flux value MAX.

Figure 9:
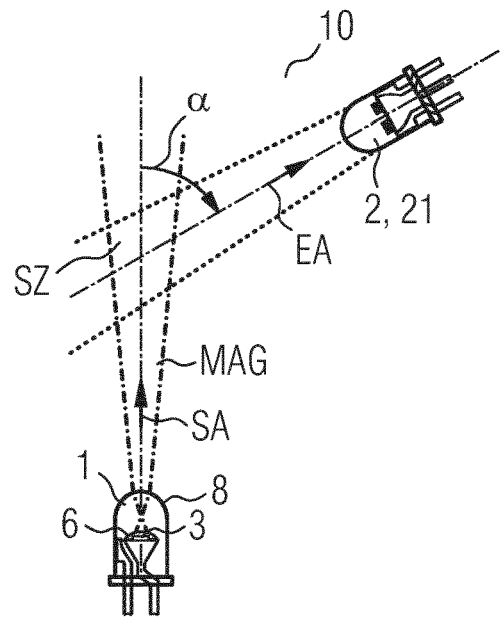
FIG. 9 shows an embodiment variant of the arrangement according to one embodiment for optical scattered light detection, comprising a light emitting diode with fluorescent luminophore and a two-channel photosensor.

FIG. 9 shows an embodiment variant of the arrangement 10 according to one embodiment for optical scattered light detection, comprising a light emitting diode 1 with preferably fluorescent luminophore 6 and a two-channel photosensor 21. The arrangement shown is a so-called forward scattered light arrangement with a scattered light angle α of less than 90°. Alternatively or additionally, the scattered light arrangement shown can be a backward scattered light arrangement with a scattered light angle α of more than 90° or a combined forward/backward scattered light arrangement. The two-channel photosensor 21 has two adjacent photosensor units, not referenced in greater detail, which with the photosensor 21 are arranged and directed in relation to the light emitting diode 1 such that both photosensor units receive essentially the same scattered light from the same scattered light center SZ. An optical filter is additionally connected in front of at least one of the photosensor units, allowing light in the first wavelength range, the second wavelength range or two wavelength ranges to pass. Therefore two photosensor signals are available per light pulse following electrical excitation of the light emitting diode 1, which signals can be assigned at least indirectly to a first and second light intensity for the first and second wavelength range and evaluated. If a filter is not connected in front of one of the photosensor units, the respective other light intensity can be calculated from the root of the difference between the square of the total "filterless" light intensity and the square of the respective other light intensity. The respective optical filter is usually a band-pass filter having a pass band in the range from 25 nm to 100 nm.

Figure 10:
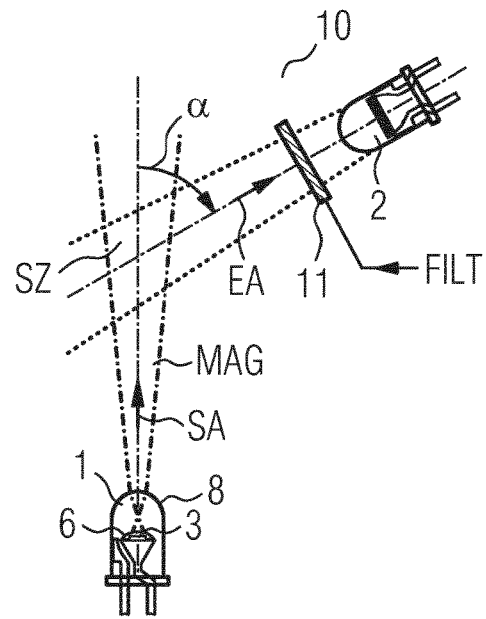
FIG. 10 shows a further embodiment variant of the arrangement according to one embodiment for optical scattered light detection, comprising a light emitting diode with fluorescent luminophore, a single-channel photosensor and an electrically switchable optical filter.

FIG. 10 shows a further embodiment variant of the arrangement 10 according to one embodiment for optical scattered light detection, comprising a light emitting diode 1 with preferably fluorescent luminophore 6, a single-channel photosensor 2 and an electrically switchable optical filter 11. The optical filter 11 is developed or configured to allow light in at least one of the two wavelength ranges to pass in alternating phases. In addition, a control unit which is connected to the light emitting diode 1 and to the optical filter 11 is configured or programmed to electrically trigger the optical filter in an alternating manner and to generate the two-color ratio or the two-color difference from the respective photosensor signal that is temporally assigned to the alternating phases. In the simplest case, a band-pass filter is connected in front of the electrically switchable filter 11 and allows light in the two wavelength ranges to pass. Depending on the triggered status of the electrically triggerable filter 11, i.e. switched on or switched off, the incident light then passes through the filter 11 or is blocked thereby. The respective band-pass filter connected in front of the electrically triggerable filter 11 preferably has a pass band in the range from 25 nm to 100 nm.

Figure 11:
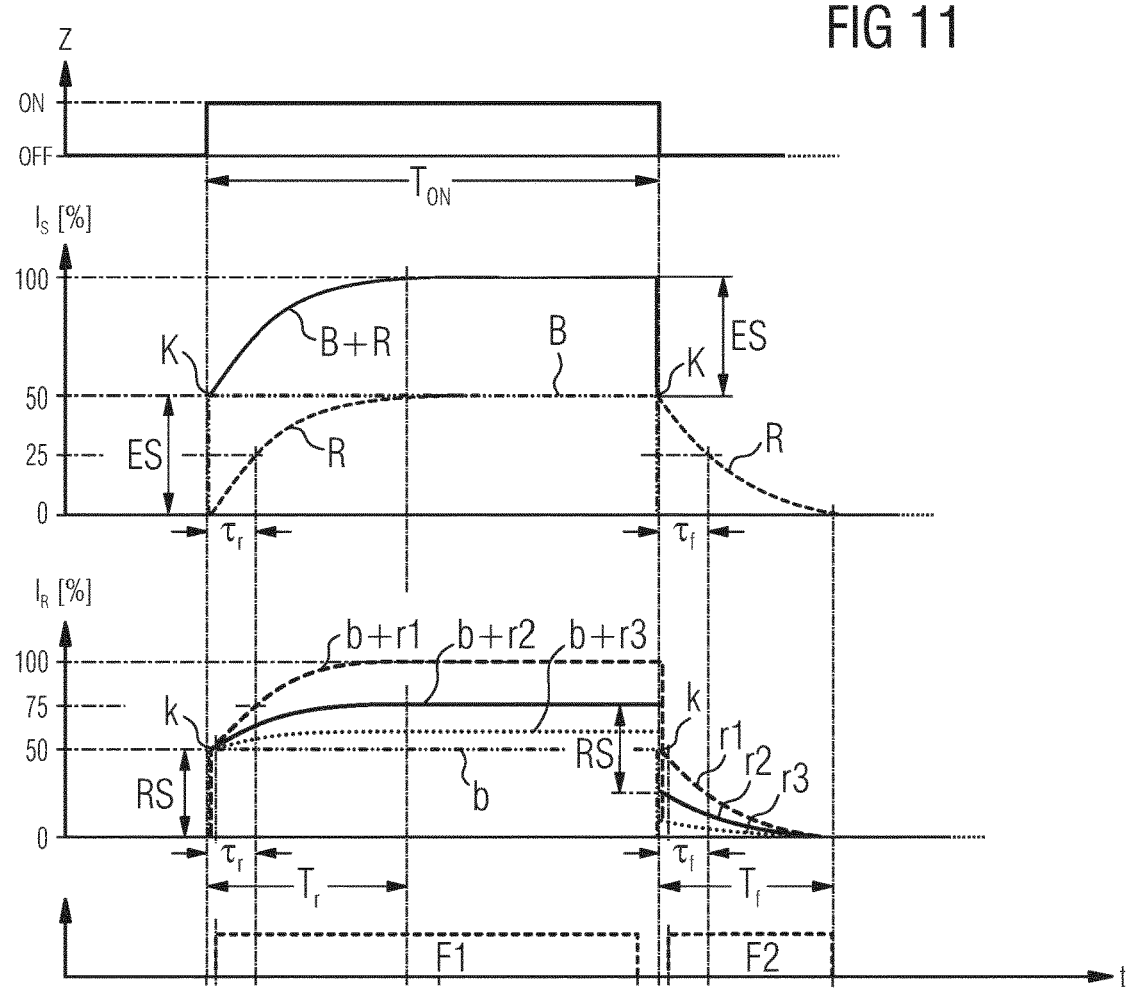
FIG. 11 shows a time-dependency diagram of the pulsed triggering of a light emitting diode with phosphorescent luminophore according to one embodiment, and an emission in the second wavelength range which is time-delayed and persistent in comparison with the spontaneous emission in the first wavelength range.

FIG. 11 shows a time-dependency diagram of the pulsed triggering of a light emitting diode with phosphorescent luminophore according to one embodiment, and an emission in the second wavelength range which is time-delayed and persistent in comparison with the spontaneous emission in the first wavelength range.

The X-axis is designated t (for time) and the Y-axes are designated Z, $I_S$ and $I_R$ respectively in the time-dependency diagrams. Z here is the switching status of the light emitting diode according to one embodiment, with the status values ON and OFF for switched on and switched off. $I_S$ designates a light intensity or luminous power emitted by the light emitting diode and normalized relative to 100%, and $I_R$ designates the scattered light intensity received by a photosensor. The previously cited 100% value corresponds to the maximum luminous power emitted by the light emitting diode and is composed of a red and a blue light portion R, B or luminous power portion.

At the time point t0, the light emitting diode is switched on suddenly and lights up for a switch-on period $T_{ON}$ until time point t5, at which the light emitting diode is switched off again suddenly. The switch-on period $T_{ON}$ preferably lies in a range from 0.2 to 10 ms.

The second time-dependency diagram illustrates how, immediately after electrical excitation of the light emitting diode, the emitted light intensity $I_S$ jumps in the form of an abrupt signal rise ES from a value of 0% to an exemplary value of 50%. The light emitting diode initially emits only blue light in this case (see dash-dot line representing the blue light portion B). At the same time, immediately after electrical excitation, the red light portion R emitted by the light emitting diode, i.e. by the light converter of the light emitting diode, also rises steadily and specifically starting from a 0% value with a rise half-value period $\tau_r$. The red light portion R asymptotically approaches a maximum value, which corresponds here to the exemplary 50% value (see broken line representing the red light portion R). At the time point t2, the red light portion R reaches half of the 50% value. The 50% value is reached at the time point t3 after approximately 5 to 7 rise half-value periods $\tau_r$. The cumulative signal B+R of two light portions B, R therefore forms a kink K in the temporal course and likewise reaches approximately the maximum value for the emitted light intensity $I_S$ or luminous power after approximately 5 to 7 rise half-value periods $\tau_r$ (see continuous line representing the sum B+R of two light portions B, R).

Correspondingly, immediately after the light emitting diode is switched off and due to the immediately subsequent discontinuation of the emitted blue portion B, the total light intensity $I_S$ falls from the steady 100% value to a value of 50%. From this time point t5 on, the light emitting diode emits only red light with a fall half-value period $\tau_f$. At the time point t7, this light portion R has fallen by 50%. The red light portion R is caused by the phosphorescence of one or more luminophores in the light converter. The light converter effectively continues to glow. After approximately 5 to 7 fall half-value periods $\tau_f$, the light emitting diode emits virtually no more light.

The third diagram illustrates the exemplary relative course of three photosensor signals or scattered light signals b+r1, b+r2, b+r3 output by the photosensor, said signals being produced as a result of scattered light from large, medium and small smoke particles in a scattered light center. The respective scattered light signal b+r1, b+r2, b+r3 is additively composed of a blue scattered light signal b and a red scattered light signal r1, r2, r3. In the present diagram, the detected blue scattered light signal b from the smoke particles of different sizes has been normalized relative to a value of 50%. According to this normalization, the relative light intensity values of the normalized scattered light signal b+r1, b+r2, b+r3 increase as the size of the smoke particles increases. Conversely, the ratio to be ascertained between the blue scattered light signal b and the respective red scattered light signal r1, r2, r3 becomes smaller as the size of the smoke particles increases.

The blue scattered light signal b is produced as a result of blue scattered light from smoke particles immediately after the light emitting diode is switched on, and jumps abruptly in the form of an abrupt signal rise RS from a value of 0% to the value which is normalized relative to 50%. The first red scattered light signal r1 is produced as a result of red scattered light from large smoke particles. The red scattered light signal r1 rises steadily from a 0% value according to the rise half-value period $\tau_r$ of the red light portion R emitted by the light emitting diode, and asymptotically approaches a maximum value of 50%. The normalized scattered light signal b+r1 therefore reaches the 100% value shown after approximately 5 to 7 rise half-value periods $\tau_r$, and again exhibits a kink k as per the second diagram. The second red scattered light signal r2 is produced as a result of red scattered light from medium smoke particles and the third scattered light signal r3 as a result of red scattered light from small smoke particles. Correspondingly, the two red scattered light signals r2, r3 rise by an exemplary value of 25% or by approximately 10% respectively.

Correspondingly, after the light emitting diode is switched off and due to the immediately subsequent discontinuation of the blue scattered light signal b, the respective red scattered light signal r1, r2, r3 falls by a value of 50% from the respective steady 100%, 75% and 60% value. From this time point t5 on, the photosensor detects only red scattered light r1, r2, r3 with a fall half-value period $\tau_f$. After approximately 5 to 7 fall half-value periods $\tau_f$, virtually no more scattered light is detectable by the photosensor.

The lower diagram illustrates two exemplary measuring time windows F1, F2 which are suitable for detecting and evaluating a scattered light signal b+r1, b+r2, b+r3 in order to determine the two-color ratio or the two-color difference. $T_r$ and $T_f$ designate a building-up period and a dying-away period between the time points t0 to t3 and t5 to t8 respectively, within which the scattered light signal b+r1, b+r2, b+r3 is not steady. The first measuring time window F1 extends from the time point t1 to a time point t4. At the time point t1, the blue scattered light signal b is already fully on. The time point t4 shows the end of the steady course of the scattered light signal b+r1, b+r2, b+r3 shortly before the light emitting diode is switched off.

A current value of the blue scattered light signal b can be detected at the time point t1, since the red scattered light signal r1-r3 is still negligible. A current value for the red scattered light signal r1-r3 can be determined from the difference between the scattered light signal b+r1, b+r2, b+r3 and the previously detected value for the blue scattered light signal b, specifically during the steady course of the scattered light signal b+r1, b+r2, b+r3 between the time points t3 and t4. Alternatively, the current value for the red scattered light signal r1-r3 can be detected directly at the time point t6, i.e. following the immediate discontinuation of the blue scattered light b after the light emitting diode is switched off. As a further alternative, the current value for the red scattered light signal r1-r3 can be detected in the non-steady phase of the scattered light signal b+r1, b+r2, b+r3, e.g. at the time points t2 or t7, at which half of the rise of the red scattered light signal r1-r3 is present based on the known rise and fall half-value period $\tau_r$, $\tau_f$.

Figure 12:
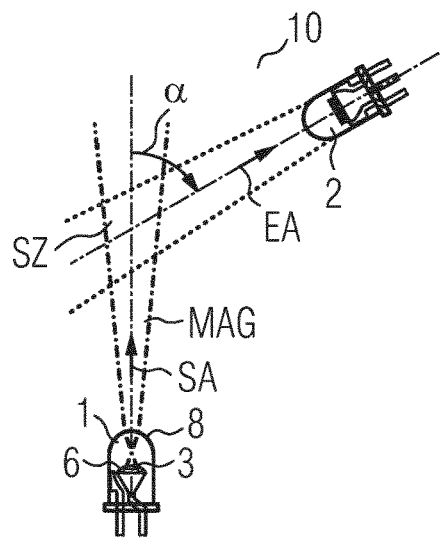
FIG. 12 shows an embodiment variant of the arrangement according to one embodiment for optical scattered light detection, comprising a light emitting diode with phosphorescent luminophore and a single-channel photosensor.

FIG. 12 shows an embodiment variant of the arrangement 10 according to one embodiment for optical scattered light detection, comprising a light emitting diode 1 with phosphorescent luminophore and a single-channel photosensor 2.

According to one embodiment, the generation of the two-color ratio or the two-color difference is effected by evaluating the temporal course of the scattered light signal originating from the photosensor. Depending on the smoke particle size and hence on the type of smoke, this scattered light signal has temporally changing light portions in the first and second wavelength range within a light pulse. The pulsed triggering of the light emitting diode 1 and the metrological detection of the scattered light signal is preferably effected by means of an electronic control unit, e.g. by means of a microcontroller. The control unit is configured to output a fire alarm as a function of the type of smoke that is determined and if a minimum level of the scattered light level is exceeded, preferably if the scattered light level assigned to the first wavelength range is exceeded.

Figure 13:
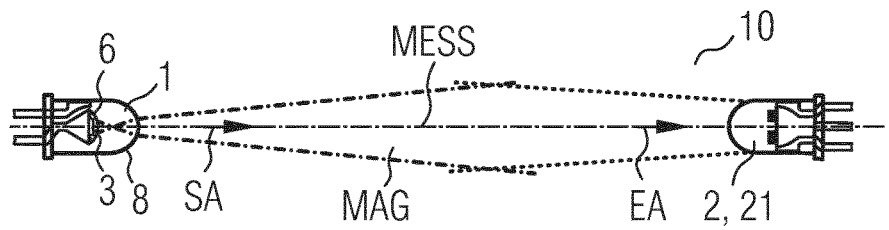
FIG. 13 shows an embodiment variant of the arrangement according to one embodiment for transmitted light measurement along a measuring distance, comprising a light emitting diode with fluorescent luminophore and two-channel photosensor.

FIG. 13 shows an embodiment variant of the arrangement 10 according to one embodiment for transmitted light measurement along a measuring distance MESS, comprising a light emitting diode 1 with fluorescent luminophore and a two-channel photosensor 21. The photosensor 21 has two adjacent photosensor units, which are so directed as to receive direct light from the light emitting diode 1. In a similar manner to the example according to FIG. 9, an optical filter is connected in front of at least one of the photosensor units, and allows light in the first wavelength range, in the second wavelength range or in two wavelength ranges to pass. The control unit is configured to output a fire alarm as a function of the ratio or the difference between the two detected sensor signals of the photosensor units, and therefore as a function of the type of smoke that is determined and if a minimum level of at least one of the two sensor signals of the photosensor units is not reached.

Figure 14:
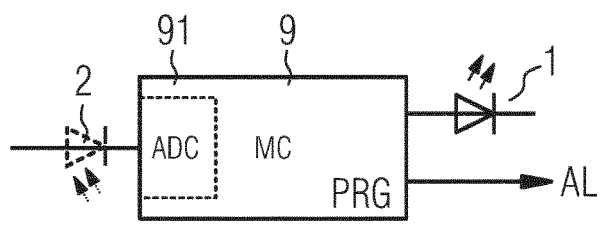
FIG. 14 shows an example of a control unit for a smoke-detection unit according to one embodiment.

FIG. 14 shows an example of a control unit 9 for a smoke detection unit according to one embodiment. The control unit 9 shown is preferably a microcontroller. As per the present example, it can already have an integrated A/D converter 91 for detecting a photosensor signal from the photosensor 2. It also has an output for the pulsed triggering of a light emitting diode 1 and an output for outputting a fire alarm AL in the event that fire is detected. PRG designates a computer program which is loaded into the microcontroller 9 and executed thereby in order to perform the optical smoke detection. The computer program PRG has suitable program steps for this purpose.

Figure 15:
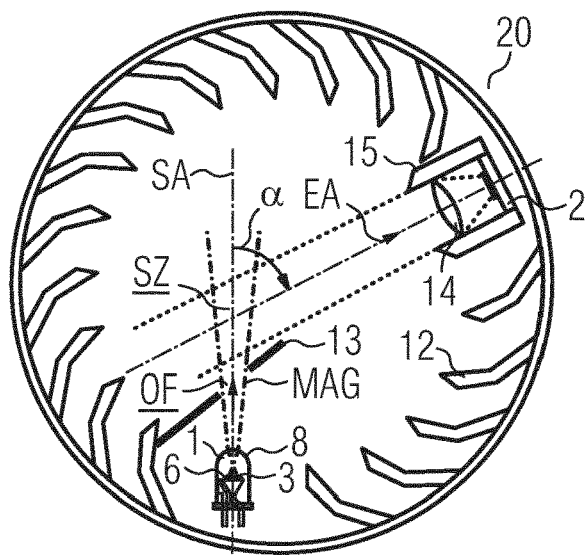
FIG. 15 shows an example of a smoke detection unit of closed structural design, having a scattered light arrangement according to one embodiment.

Lastly, FIG. 15 shows an example of a smoke detection unit 20 of closed structural design, having a scattered light arrangement 10 according to one embodiment.

Such smoke detectors are also referred to as fire alarms. They typically have a housing comprising at least one smoke entry opening and the smoke detection unit 20 accommodated in the housing. The smoke detection unit 20 preferably comprises an optical measurement chamber which is screened against ambient light but is permeable by smoke which has to be detected. The latter typically also has a multiplicity of ambient light-screening laminations 12 and is therefore also referred to as a labyrinth.

Both structural elements are typically electrically connected to a circuit board, which is usually situated outside the detection unit 10 and adjoins this. Further structural elements can also be arranged on the circuit board, e.g. a microcontroller, active or passive structural elements.

The light emitting diode 1 has a plastic housing 8, which forms an optical lens for the concentration of light beams generated by the light emitting diode 1 in the direction of a collimator opening OF. The light emitting diode 1 shown here corresponds in its external appearance to a typical 5 mm light emitting diode for "through-hole assembly", having a plastic housing diameter of 5 mm. The reference signs 13, 15 designate collimators for the light emitting diode 1 and the photosensor 2. The reference sign 14 designates an optical receiver lens for the photosensor 2. The photosensor 2 is preferably a photodiode, in particular a silicon PIN photodiode and preferably a silicon PIN photodiode with increased sensitivity to blue.

LIST OF REFERENCE SIGNS

1, 1' (Two-color) light emitting diode, LED, laser diode
2 Photosensor, semiconductor photodiode, silicon PIN photodiode
3 Blue LED chip, UV LED chip, surface emitter
4 Red LED chip, IR LED chip, surface emitter
5 Carrier, supporting plate
6 Light conversion layer, light converter
7 Connection contacts
8 Housing, plastic housing, LED housing
9 Control unit, microcontroller
10, 10' Arrangement
11 Switchable optical filter
12 Lamination, light-screening element
13 Collimator, aperture
14 Optical lens, receiver lens
15 Receiver collimator
20 Smoke detection unit, optical measurement chamber, smoke measurement chamber
21 Two-channel photosensor, two-channel photodiode
71, 72 Connection contacts
91 Analog/digital converter, ADC
α Scattered light angle
$\tau_r$, $\tau_f$ Rise half-value period, fall half-value period
AL Alarm, alarm information
b Blue scattered light signal, normalized
B Emitted blue light portion
B+R Total emitted light
b+r1, b+r2, Relative scattered light signal b+r3
BB Bandwidth of the blue peak, half-width
BL Light pencil, "blue" light pencil
BP Blue peak, significant blue peak value, blue spectral band, blue spectral line
BR Bandwidth of the red peak, half-width
B2 Bandwidth of the colored peak, half-width
BR Light pencil, "red" light pencil
EA Receiving axis, optical axis
ES Abrupt signal rise (at LED)
F1-F3 Measuring time windows
FILT Filter switching signal
k, K Kink, kink point, jump
LI Optical lens, LED lens
LI' Separate lens unit with light converter
LU Minimum bandwidth, band gap
M1, M2 Wavelength peak value, maximum
MAG Magenta-colored light pencil
MAX Maximum relative light flux
MESS Measuring distance
MG1, MG2 Spectrum of a magenta-colored LED
OF Collimator opening
PRG Software program, computer program product
r1-r3 Red scattered light signal, normalized
R Emitted red light portion
RS Abrupt signal rise (at photosensor)
RP Red peak, significant red peak value, red spectral band, red spectral line
SA Transmission axis, axis of symmetry of the LED, geometric main axis of the LED
SP1, SP2 Spectrum of a white LED
SZ Scattered light center
$T_{ON}$ Switch-on period
$T_r$, $T_f$ Delay time, integration time
Z Switching status

What is claimed is:

1. A system for optical smoke detection using a two-color principle, the system comprising:
    a light emitting diode (LED); and
    a photosensor spectrally coordinated with the LED,
    wherein the LED comprises:
        an LED chip configured to emit light in a first wavelength range; and
        a light converter configured to convert part of the emitted light from the LED chip into light in a second wavelength range;
        wherein the second wavelength range has a spectral half-width having a maximum of 150 nm;
    wherein a relative light flux of a total emitted light between a main wavelength of the first wavelength range and a main wavelength of the second wavelength range does not exceed a light flux value of a maximum of 15% of a maximum light flux value normalized relative to 100% in a total emission spectrum of the LED, within a minimum bandwidth of 100 nm.

2. The system of claim 1, wherein the light converter has at least one luminophore with luminescent properties.

3. The system of claim 1, wherein the light converter is deposited directly on the LED chip or arranged at a distance from the LED chip.

4. The system of claim 1, wherein the light converter has at least one fluorescent luminophore comprising inorganic crystalline materials with doping elements introduced into the crystal structure as imperfections.

5. The system of claim 1, wherein the light converter has at least one phosphorescent luminophore comprising inorganic crystalline materials with doping elements introduced into the crystal structure as imperfections.

6. The system of claim 5, wherein the at least one luminophore has:
    a fall half-value period ($\tau_f$) in the range from 10 µs to 50 ms for a period of persistence of the luminophore following a discontinuation of an optical excitation by the LED chip, or
    a rise half-value period ($\tau_r$) in the range from 10 µs to 50 ms for an optical charging of the luminophore starting with the optical excitation by the LED chip.

7. A smoke detector, comprising:
    an optical smoke detection unit using a two-color principle and comprising:

a light emitting diode (LED); and
a photosensor spectrally coordinated with the LED,
wherein the LED comprises:
an LED chip configured to emit light in a first wavelength range; and
a light converter configured to convert part of the emitted light from the LED chip into light in a second wavelength range;
wherein the second wavelength range has a spectral half-width having a maximum of 150 nm, and
a control unit connected to the LED and to the photosensor and configured to:
trigger the LED for light emission,
detect a photosensor signal of the photosensor,
determine a first light intensity for the first wavelength range and a second light intensity for the second wavelength range based on a temporal analysis of the photosensor signal,
determine a two-color ratio or a two-color difference based on the first and second light intensities, and
perform a fire alarm function based at least on the determined two-color ratio or the two-color difference;
wherein a relative light flux of a total emitted light between a main wavelength of the first wavelength range and a main wavelength of the second wavelength range does not exceed a light flux value of a maximum of 15% of a maximum light flux value normalized relative to 100% in a total emission spectrum of the LED, within a minimum bandwidth of 100 nm.

8. The smoke detector of claim 7, wherein:
the photosensor comprises a two-channel photosensor and includes two photosensor units,
an optical filter is connected in front of at least one of the two photosensor units and allows light in the first wavelength range or in the second wavelength range to pass, and
the control unit is configured to determine the two-color ratio or the two-color difference based on the determined first and second light intensities.

9. The smoke detector of claim 7, wherein:
the photosensor comprises a single-channel photosensor,
an electrically switchable optical filter is connected in front of the single-channel photosensor and is configured to filter out light in at least one of first and second wavelength ranges in alternating phases,
the control unit is configured to:
electrically trigger the optical filter in an alternating manner, and
generate the two-color ratio or the two-color difference based on the light intensities of the photosensor signal that are temporally assigned to the alternating phases.

10. The smoke detector of claim 7, wherein the control unit is configured to:
determine the two-color ratio or the two-color difference based at least on a magnitude of an abrupt signal rise of the detected photosensor signal immediately after the LED is switched on, and/or
determine the two-color ratio or the two-color difference based at least one a magnitude of an abrupt signal fall of the detected photosensor signal immediately after the LED is switched off.

11. The smoke detector of claim 7, wherein:
the control unit is configured to repeatedly trigger the LED in a first smoke detection phase using a switch-on period ($T_{ON}$) in a period range of a rise half-value period ($\tau F$)±50% to emit light predominantly in the first wavelength range,
the control unit is further configured to trigger the LED in a second smoke detection phase using a switch-on period ($T_{ON}$) in a period range of a multiple of the rise half-value period ($\tau F$) in the event that the detected photosensor signal deviates by a minimum value from a predetermined signal limit value, and
the control unit is configured to:
determine, in the second smoke detection phase, the two-color ratio or the two-color difference based at least on a magnitude of an abrupt signal rise of the detected photosensor signal immediately after the LED is switched on, and/or
determine the two-color ratio or the two-color difference based at least on a magnitude of an abrupt signal drop of the detected photosensor signal immediately after the LED is switched off.

12. The smoke detector of claim 7, further comprising a housing,
wherein the LED and the photosensor are arranged in a scattered light arrangement and directed at a common scattered light center,
wherein the housing includes smoke entry openings for passage of ambient air into an interior of the housing, and
wherein the housing is screened against penetration of direct ambient light into the interior of the housing.

13. The smoke detector of claim 7, wherein:
the smoke detection unit is arranged in a housing,
the LED and the photosensor are arranged such that the photosensor detects direct light from the LED,
the housing includes smoke entry openings for passage of ambient air into an interior of the housing, and
the housing is screened against penetration of direct ambient light into the interior of the housing.

14. The smoke detector of claim 7, further comprising a housing,
wherein the smoke detection unit is arranged in the housing,
wherein the LED and the photosensor are arranged in or on the housing and are directed optically at a common scattered light center located outside the smoke detector.

15. A method of optical smoke detection using a light emitting diode (LED) according to a two-color principle, wherein the LED comprises: controlling an LED chip to provide pulsed light emission in a first wavelength range; using a light converter having at least one luminophore to convert part of the emitted light from the LED into light in a second wavelength range; wherein the second wavelength range has a spectral half-width having a maximum of 150 nm; wherein a relative light flux of a total emitted light between a main wavelength of the first wavelength range and a main wavelength of the second wavelength range does not exceed a light flux value of a maximum of 15% of a maximum light flux value normalized relative to 100% in a total emission spectrum of the LED, within a minimum bandwidth of 100 nm.

16. The method of claim 15, comprising temporally changing light portions in the first and second wavelength range within a light pulse,
wherein the at least one luminophore has a fall half-value period ($\tau_f$) in the range from 10 μs to 50 ms for a period of persistence of the luminophore following a discontinuation of an optical excitation by the LED chip, or a rise half-value period ($\tau_r$) in the range from 10 μs to 50 ms for an optical charging of the luminophore starting with the optical excitation by the LED chip, and
wherein the two-color ratio or the two-color difference is determined based on the temporally changing light portions within the light pulse.

\* \* \* \* \*